United States Patent [19]

Kusama et al.

[11] Patent Number: 5,138,255
[45] Date of Patent: Aug. 11, 1992

[54] METHOD AND APPARATUS FOR MEASURING LIFETIME OF SEMICONDUCTOR MATERIAL INCLUDING WAVEGUIDE TUNING MEANS

[75] Inventors: Tateo Kusama; Kinio Iba, both of Tokyo, Japan

[73] Assignee: Semitex Co., Ltd., Tokyo, Japan

[21] Appl. No.: 730,114

[22] Filed: Jul. 15, 1991

Related U.S. Application Data

[62] Division of Ser. No. 475,768, Feb. 5, 1990, Pat. No. 5,081,414.

[30] Foreign Application Priority Data

| Mar. 20, 1989 | [JP] | Japan | 1-68971 |
| Mar. 20, 1989 | [JP] | Japan | 1-68972 |
| May 2, 1989 | [JP] | Japan | 1-112985 |

[51] Int. Cl.$^5$ ............... G01R 31/26; G01R 27/06
[52] U.S. Cl. ............... 324/158 D; 324/158 R
[58] Field of Search ............... 324/158 R, 158 D, 642, 324/95, 702; 333/33, 253, 219; 437/8

[56] References Cited

U.S. PATENT DOCUMENTS

| 3,745,479 | 7/1973 | Okabe et al. | 333/219 |
| 3,919,639 | 11/1975 | Graff et al. | 324/158 D |
| 3,939,415 | 2/1976 | Terasawa | 324/158 D |
| 4,087,745 | 5/1978 | Kennedy, Jr. et al. | 324/642 |
| 4,240,050 | 12/1980 | Powell | 333/33 |
| 4,739,258 | 4/1988 | Schwarz | 324/703 |
| 4,761,625 | 8/1988 | Sharma | 333/33 |
| 4,839,588 | 6/1989 | Jantsch et al. | 324/642 |
| 4,949,034 | 8/1990 | Imura et al. | 324/642 |

Primary Examiner—Vinh Nguyen
Attorney, Agent, or Firm—Wenderoth, Lind & Ponack

[57] ABSTRACT

A method and apparatus measure the lifetime of semiconductor materials having resistivity values within a predetermined measurement range. Carriers are produced within the semiconductor material responsive to incident energy. Microwave energy is radiated from a waveguide onto the semiconductor material to obtain reflected microwave energy. The equivalent distribution circuit characteristics of the waveguide are varied such that a variation of a magnitude of the reflective microwave energy relative to a resistivity of the semiconductor material is substantially linear within the predetemined measurement range. Plural stub tuners are provided within the waveguide to obtain the desired linear characteristics. The lifetime measurement is obtained in accordance with an attenuation of the produced carriers.

6 Claims, 10 Drawing Sheets

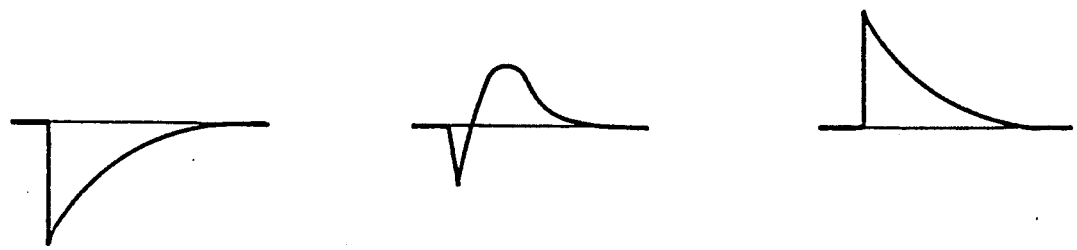
PRIOR ART
FIG.5A
PRIOR ART
FIG.5B
PRIOR ART
FIG.5C
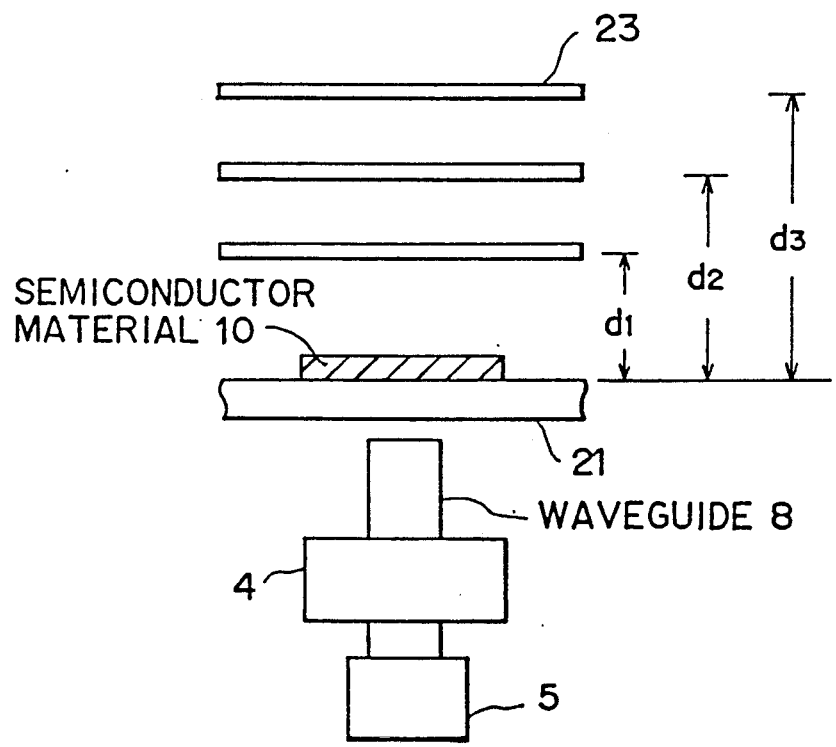
PRIOR ART
FIG.6

INTENSITY OF REFLECTIVE MICROWAVE

METHOD AND APPARATUS FOR MEASURING LIFETIME OF SEMICONDUCTOR MATERIAL INCLUDING WAVEGUIDE TUNING MEANS

CROSS REFERENCE TO RELATED APPLICATION

This application is a Divisional application of Ser. No. 07/475,768, filed Feb. 5, 1990, which issued as U.S. Pat. No. 5,081,414 on Jan. 14, 1992.

BACKGROUND OF THE INVENTION

1. Field of the Invention

The present invention relates to a method for measuring the lifetime of a semiconductor material and an apparatus therefor, and in particular, to a method and a device for determining the lifetime of the semiconductor material in which pulse energy is injected into the semiconductor material in order to generate a particular attenuation of a carrier, and by measuring the attenuation characteristics of the carrier, highly reliable and effective detection of a defective semiconductor material crystal and a very small heavy metal taint is enabled.

2. Description of the Prior Art

Semiconductor materials, such as Si, Ga and As, are processed according to several hundreds of processing steps, including raw material preparation steps through to semiconductor device manufacturing steps. These raw material preparation and the semiconductor device manufacturing steps include material washing, impurity diffusion, thermal treatment, patterning and etching, and each disadvantageously introduces the possibility of the generation of defective crystals and heavy metal taints in the semiconductor material. Furthermore, since the number of such troublesome processing steps is very high, the control or management of these steps, which necessitate many laborious and precise operation, is very difficult.

Nevertheless, it is inevitable that some semiconductor materials or chips having defective crystals and/or heavy metal taints or pollutants will be produced at a certain rate. As a result, a number of devices for identifying defective crystals and fine metal taints in semiconductor materials or chips have been widely marketed. A general and conventional process for measuring and analyzing defective crystals in the semiconductor materials or chips has been used for determining the respective lifetimes of the chips.

FIG. 1 is a block diagram of the structure of a prior art apparatus for measuring the lifetime of a semiconductor material.

As shown in FIG. 1, microwave energy generated by a microwave oscillator 1 is guided by a magic tee 4 to a wave guide 8 via an impedance matching device 2 and an E-H tuner 3, and is irradiated onto a semiconductor material 10 which is the object of the measurement. The microwave energy ⓐ irradiated onto the semiconductor material 10 is reflected from the near surface of the material 10, from within the material 10, and from the reverse surface of the material 10, respectively, and returns to the magic tee as microwave energy ⓑ which is guided by the magic tee 4 to the E-H tuner 6 and detected by a detector 7.

The principle of the lifetime measurement will now be explained referring to FIG. 2, where the reference ⓐ denotes microwave energy which is constantly applied to the semiconductor material 10. Carriers are operatively produced when external energy is fed to the semiconductor material 10 in the form of pulses from a laser diode 9 at a time of the measurement. Since this area producing the carriers is equivalent to the semiconductor turning into a conductor, and since the microwave energy is reflected from the produced carriers (microwave energy is reflected 100% on a metal), the reflection of the microwave energy is detected as a temporary increase in the region. The chronological change of the increased microwave energy coincides with the chronological attenuation waveform of the produced carriers. Therefore, the crystal in the semiconductor material 10 can be evaluated by measuring the attenuation waveform (lifetime) of the produced carriers.

The respective views FIGS. 3A to 3C show examples of microwave irradiation set ups of a conventional apparatus for measuring the semiconductor lifetime. In particular, FIG. 3A depicts a microwave irradiation set up provided with a measurement table 21 made of non-metal material and a waveguide 8 for emitting and receiving the microwave energy, and a semiconductor material 10 to be measured being placed on the measurement table 21. FIG. 3B shows another microwave irradiation set up provided with the waveguide 8 described above and a measurement holder 22 made of non-metal material on which a semiconductor material 10 to be measured is held, the measurement holder 22 being used in place of the measurement table 21 shown in FIG. 3A. FIG. 3C shows still another example of a microwave irradiation set up having a metal plate 23 from which the microwave energy reflects, in addition to the measurement table 21 having the semiconductor material 10 placed thereon and the waveguide 8.

A contactless inspection method, such as a DLTS method (Deep Level Transient Spectroscopy), has been widely employed to detect fine or very small metal taints in a semiconductor material. According to the DLTS method, a diode is formed on a substrate and a voltage is impressed on the diode, generating a response to the impression after the voltage is cut off. The response as shown in FIG. 13D is measured or determined in the form of a changed amount I in the electric signal between the instants $t_1$ and $t_2$. The relation between the values of the changed amount I and temperature are plotted to determine the degree of metal taints using particular thermal peak values of the changed amount I based on various metals.

Although the object materials of the lifetime measurement are usually semiconductor materials, such as a Si-wafer, the resistivity of the materials ranges fairly extensively depending on the usage of devices.

The waveguide 8 which is used in the prior art lifetime measuring apparatus can be equivalently replaced with a distribution circuit as shown in FIG. 4A. If the distribution circuit is terminated with a terminal resistance $Z_1$, a reflected signal corresponding to the terminal resistance $Z_1$ is produced as shown in FIG. 4B. Accordingly, in the case of the apparatus shown in FIG. 1 for example, the horizontal axis Z in FIG. 4B may be replaced with the resistivity $\rho_s$ since the terminal resistance $Z_1$ is equivalent to the resistivity of the Si-wafer. The signal of the reflected microwave energy measured in the regions a, c and b corresponding to the resistivities $\rho_a$, $\rho_{o1}$ and $\rho_b$ shown in FIG. 4B becomes as shown in FIGS. 5A, 5B and 5C, respectively. The region c is where the measurement is impossible. In other regions, such as d, e and f, the reflected microwave signals to be measured are greatly influenced by the non-linear characteristics of the above mentioned waveguide to thereby have significantly changed in signal intensity and deteriorated in data reproducibility. The prior art method is problematic since it cannot measure some of the object materials with a high reliability.

From another standpoint the prior art is problematic in that according to the conventional process for analyzing a character of the semiconductor material or for locating any defective crystals as shown in FIG. 3A, the effective amount of the reflected microwave signal is small due to the effects of the microwave energy (a)' passing disadvantageously through the semiconductor material 10 and the microwave energy (b)' reflecting from the measurement table 21. According to the conventional device as shown in FIG. 3B, the microwave energy (b) has a small S/N ratio value because the microwave energy passes through the semiconductor material 10 and is reflected on the measurement holder 22. In order to improve the S/N ratio of the signal by making the microwave (a)' passing through the semiconductor material 10 reflected on the metal plate 23 so as to increase the volume of the microwave (b) reflected from the semiconductor material 10, the device shown in FIG. 3C is utilized. This device essentially has disadvantages in that the signal output is unstable in its amplitude and period since the two microwave signals overlap in their phases. Especially, with regard to the device shown in FIG. 3C, the waveshape of the reflected microwave signal changes as shown in FIGS. 5A to 5C according to respective positions $d_1$, $d_2$ and $d_3$ of the metal plate 23 as shown in FIG. 6, thus disadvantageously generating non-effective signals. In brief, the reflected microwave signal is apt to change according to the particular thickness of the semiconductor material 10 to be measured, the position of the metal plate 23, the thickness of the measurement table 21, the positional relationship between the measurement table 21 and the waveguide 8, and the like, thus generating data of little reliability.

It is noted that the amount of the reflected microwave signal is very small when a short lifetime of the semiconductor chip is measured, so that the reliability of data deteriorates because that the microwave signal is amplified through an amplifier and the lifetime data is electrically delayed.

From still another standpoint the prior art is problematic, in that according to the conventional inspection method a contact breakage inspection must be carried out for the semiconductor chips or material. While the conventional process for measuring the lifetime of the semiconductor material has considerable positive achievements concerning the measurements of defective crystal lattices, metal taint $O_2$ swirls and the like, it has problems in the inspection of very small metal taints and surface and bulk lifetimes. Accordingly, the DLTS method of a breakage type has been used unavoidably to detect very small metal taints.

It is apparent from above that it has not been possible to detect very small metal pollutants in semiconductor chips using a non-contact method.

SUMMARY OF THE INVENTION

The present invention is provided considering the above situation. It is accordingly a primary object of the present invention to provide a method for measuring the lifetime of a semiconductor material which can detect crystals existing in the material with a high reliability.

It is another object of the present invention to provide a method and an apparatus for the lifetime measurement of the semiconductor material which is improved in measurement reliability through improved data reproducibility and adaptable to the semiconductor material to be measured.

It is still another object of the present invention to provide a method and an apparatus for measuring the lifetime of the semiconductor material by detecting the very small metal taints in the semiconductor material or chips.

According to one aspect of the present invention, for achieving the objects described above, there is provided a method for measuring the lifetime of a semiconductor material which includes positioning a metal face on which microwave energy passing through the semiconductor material reflects so as to be opposed to the semiconductor material, determining a particular distance between the semiconductor material and the metal face, such a distance making the effect of a microwave energy portion reflected on the metal face to another portion of the microwave energy smallest positioning a non-metal material or member having a thickness identical to the distance in a space between the semiconductor material and the metal face, and finely adjusting the distance between the wave detector or waveguide irradiating the microwave energy and the semiconductor material.

According to another aspect of the present invention, there is provided a method for measuring the lifetime of a semiconductor material using equivalent distribution circuit characteristics of a waveguide which is used for irradiating microwave onto the semiconductor material variable, shifting regions where the measurement is impossible due to characteristics outside of a measurable area on the semiconductor material, and conducting the measurement within the region of the equivalent distribution circuit characteristics which are linearized. There is provided an apparatus for measuring the lifetime of the semiconductor material including an adjusting means on the waveguide for irradiating the microwave onto the semiconductor materials for making the equivalent distribution circuit characteristics thereof variable.

According to still another aspect of the present invention, there is provided a method for measuring the lifetime of a semiconductor material which includes changing the temperature of the semiconductor material when a lifetime of the semiconductor material is measured.

The nature, principle and utility of the present invention will become more apparent from the following detailed description when read in conjunction with the accompanying drawings.

BRIEF DESCRIPTION OF THE DRAWINGS

In the accompanying drawings:

FIGS. 3A to 3C and FIG. 6 are respectively views depicting a conventional process for measuring the lifetime of the semiconductor material;

FIGS. 5A to 5C are graphs showing signal waveforms of the reflected microwave energy, respectively;

DESCRIPTION OF THE PREFERRED EMBODIMENT

The preferred embodiment of the method for measuring the lifetime of a semiconductor material and the apparatus therefor according to the present invention will be explained with reference to the drawings.

Figure 7B:
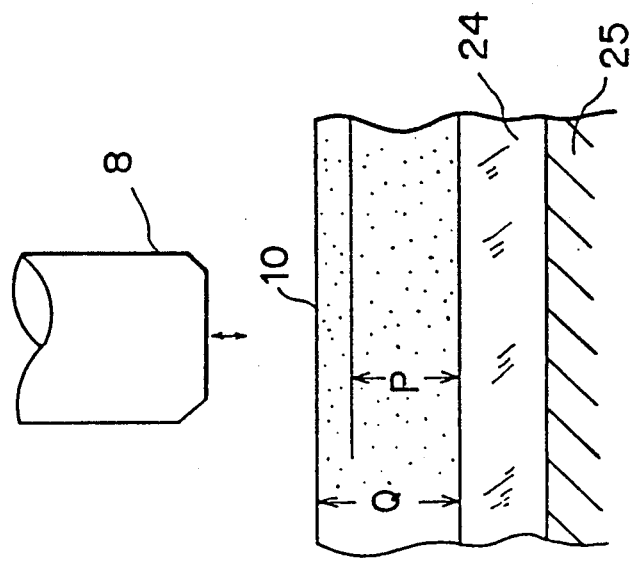
FIG. 7B is a view depicting an enlarged view of the encircled portion shown in FIG. 7A.
Figure 7A:
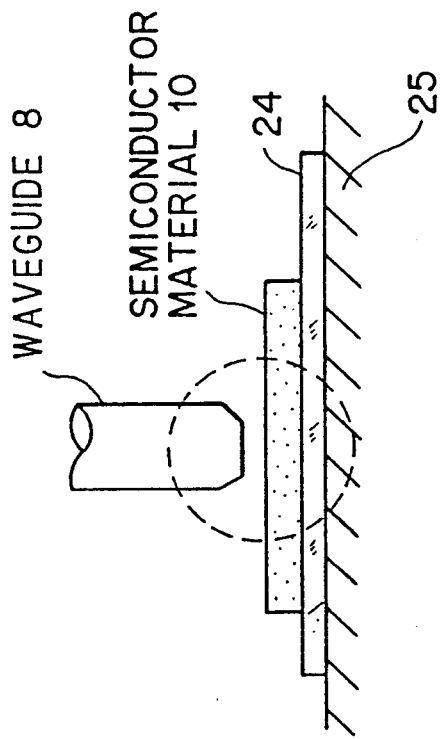
FIG. 7A is a view depicting a feature of the lifetime measuring of the apparatus for carrying out the measurement method according to the present invention.

According to the apparatus of the present invention, as shown in FIG. 7A, a quartz glass plate 24 is placed on a metal table 25, and a semiconductor material 10 to be measured is placed on the quartz glass plate 24. A more detailed view is shown in FIG. 7B.

Figure 8:
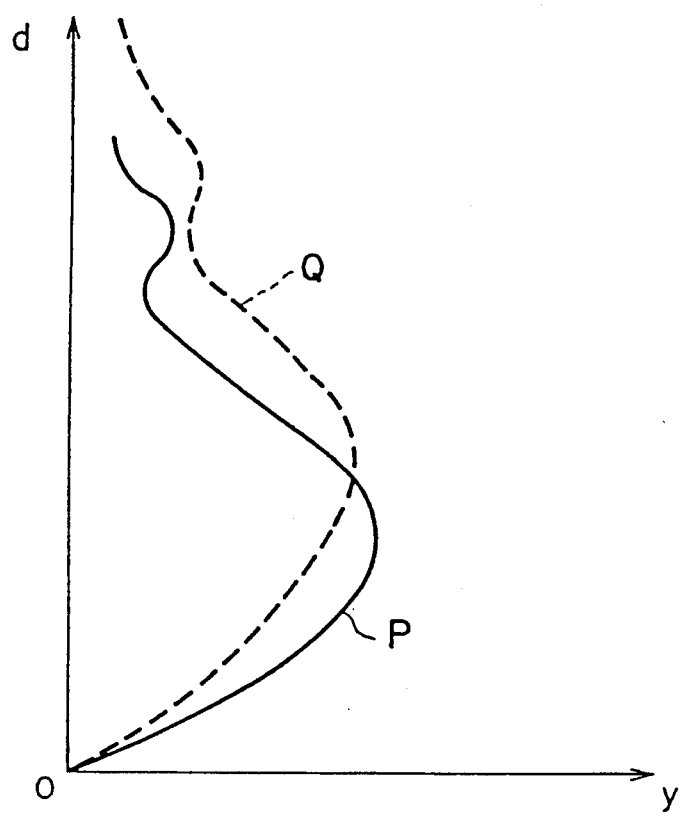
FIG. 8 is a graph showing the change of the intensity of reflective microwave energy.

In the operation of the measurement apparatus shown in FIGS. 7A and 7B, a portion of the microwave energy irradiated from a waveguide 8 (for outputting and receiving microwave energy) reflects on the semiconductor material 10 and another portion of the microwave energy passes through the semiconductor material 10. A portion of the microwave energy which has passed through the semiconductor material 10 reflects on the quartz glass plate 24 and another portion of this microwave energy passes through the quartz glass plate 24 and reaches the surface of the metal table 25. It is understood that the reflected microwave energy received by the waveguide 8 is mainly that which has reflected from the semiconductor material 10 and the metal table 25. The phasic relation between these two reflected microwave energy is determined by the distance between the semiconductor material 10 and the metal table 25. Accordingly, it is possible to determine this distance using the effect of the portion of the microwave energy reflected from the metal table 25 to the portion of the microwave energy reflected from the semiconductor material 10 by continuously checking the phasic relation. When the thickness of the semiconductor material 10 to be measured is previously determined, the distance between the semiconductor material 10 and the metal table 25 is controlled by adjusting the thickness (for example, 2 to 3 mm) of the quartz glass plate 24. Accordingly, it is possible to maximize the intensity of the effective reflective microwave energy. Further, when the thickness of the semiconductor material 10 varies a little (for example, it is shown by P or Q), the position of the waveguide 8 for outputting and receiving the microwave is finely adjusted to instantly obtain the maximum reflective microwave energy as shown in FIG. 8.

Figure 1:
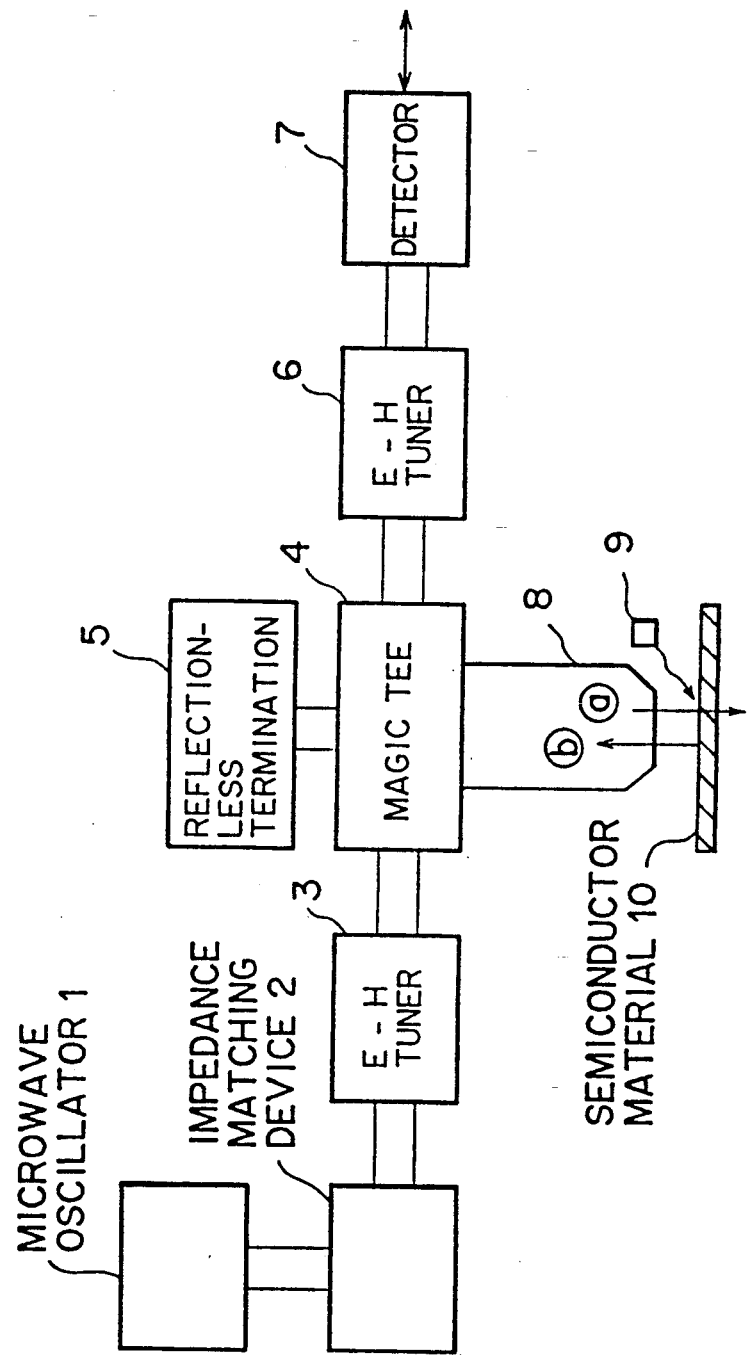
FIG. 1 is a block diagram showing the structure of the prior art apparatus for measuring the lifetime of a semiconductor material.
Figure 2:
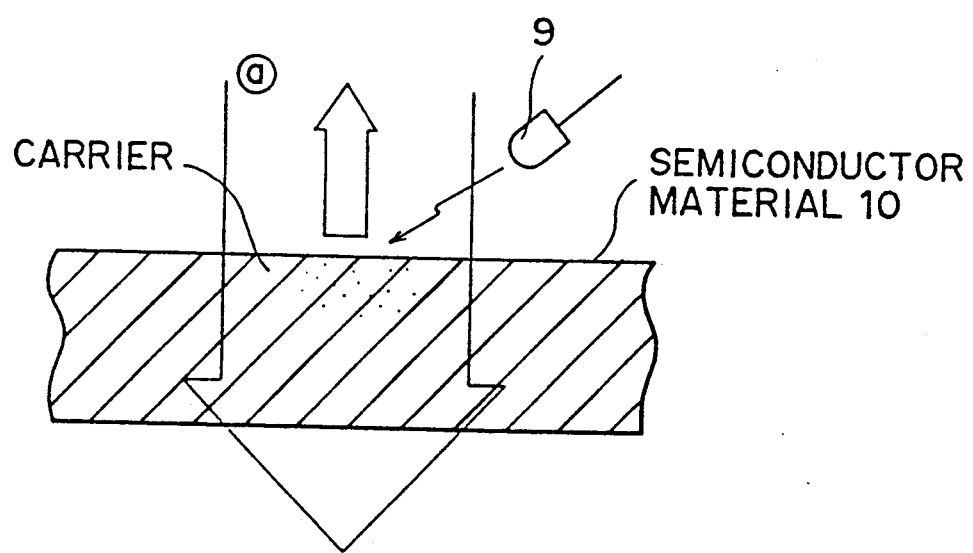
FIG. 2 is an explanatory view for describing the principle of the prior art lifetime measurement.
Figure 3A:
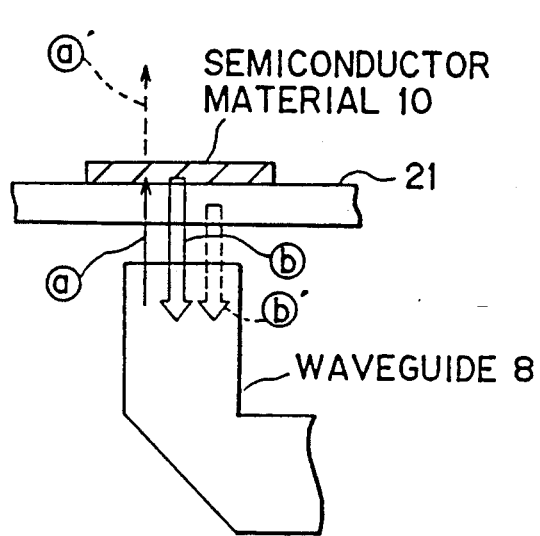
Figure 3B:
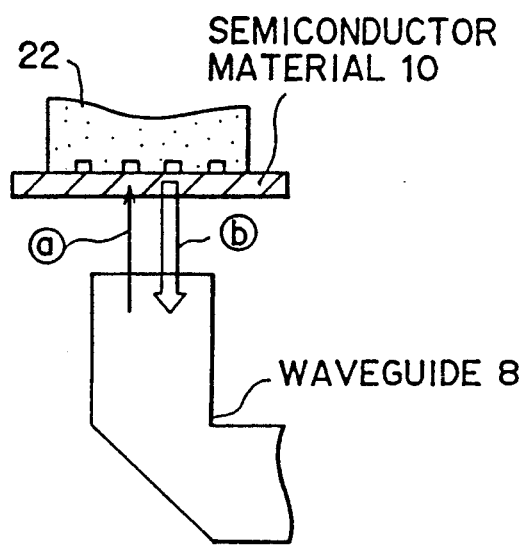
Figure 3C:
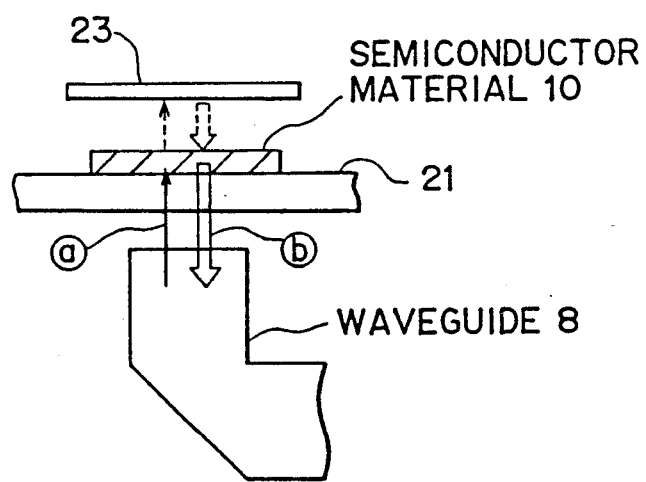
Figure 4A:
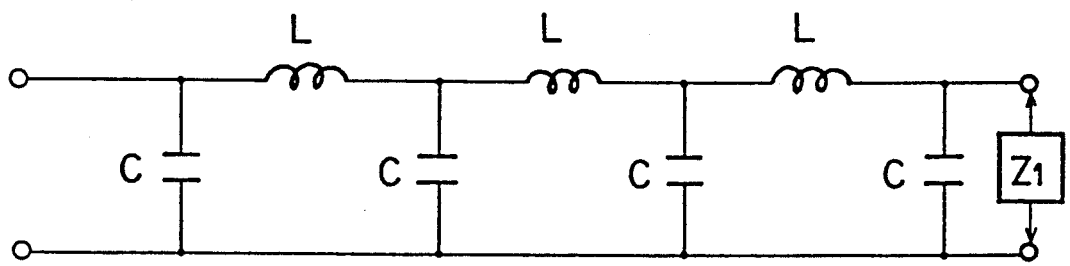
FIGS. 4A and 4B are views for describing characteristics of the waveguide.
Figure 4B:
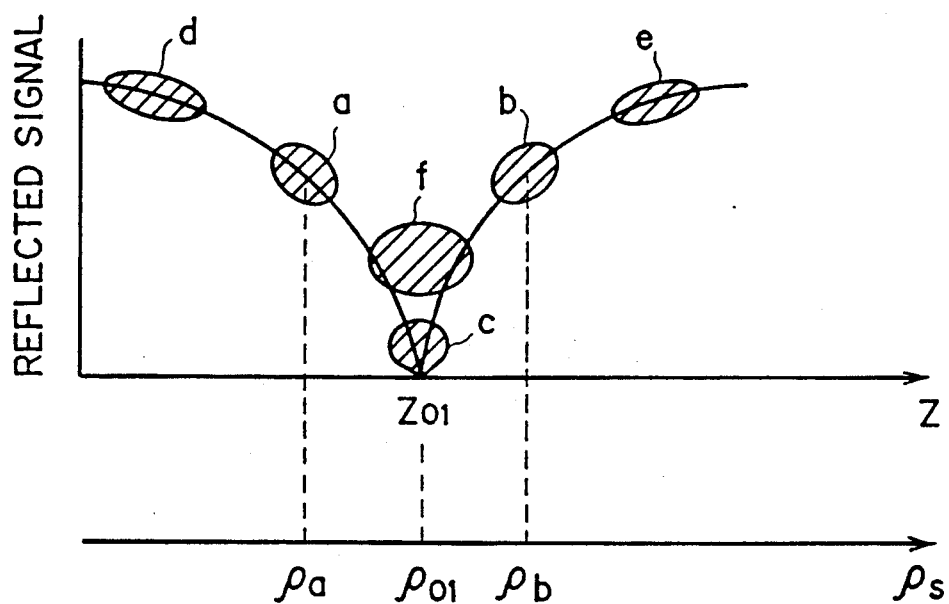

According to the preferred embodiment of the measurement method of the present invention, the metal plate 23 shown in FIG. 3C is used and a quartz glass plate having a fixed-thickness is introduced. The quartz glass plate is employed in the preferred embodiment as a non-metal material of the measurement table 21 in FIG. 3C. However, it is apparent that any non-metal material other than quartz glass may be used in the method of the present invention.

It is noted that the method for measuring the lifetime of the semiconductor material according to the present invention enables an increased output precision by more than several fold in comparison to the conventional measurement method and a constant generation of highly reliable lifetime signals having no-strain through the reflective microwave energy. When the semiconductor material to be measured by the present invention is the widely employed CZ-silicon, the signals containing the lifetime information can be treated without applying any amplifying steps, can enjoy a wide range of measurable proportional resistivities and can result in a significantly improved S/N ratio. In addition, notwithstanding the relatively easy and simple treatment of the output signals, it is possible to obtain an improved reliability, economy and maintenance.

Figure 9:
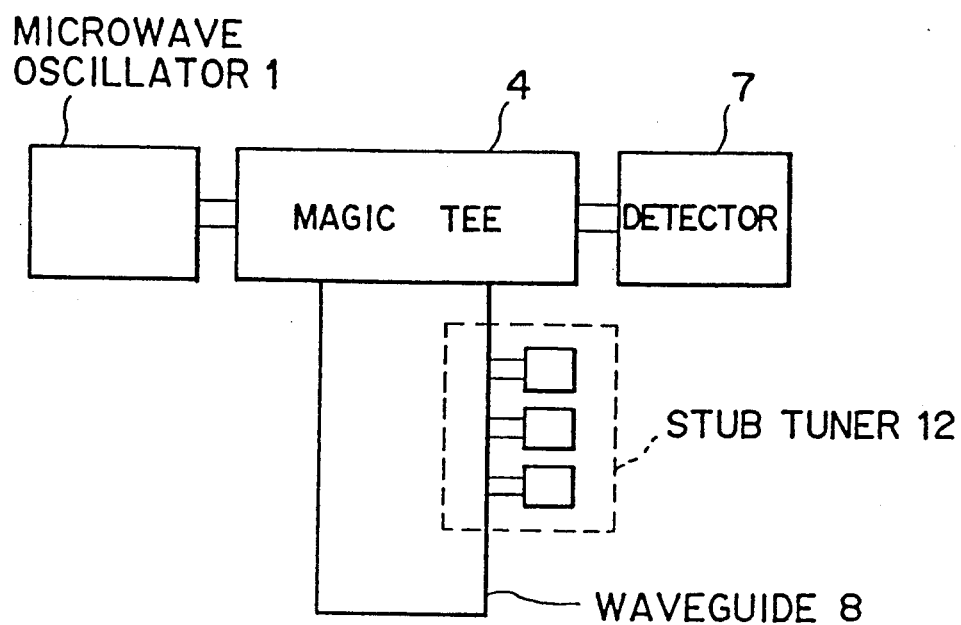
FIG. 9 is a structural view showing an apparatus according to the present invention.

In FIG. 9, the microwave energy oscillated by a microwave oscillator 1 is directed to a waveguide 8 via a magic tee 4 and irradiated onto a semiconductor material (not shown) which is an object of the measurement. The microwave energy is reflected by the semiconductor material to return to the waveguide 8, passed through the magic tee 4 and detected by a detector 7. The waveguide 8 is provided with a stub tuner 12.

Figure 10:
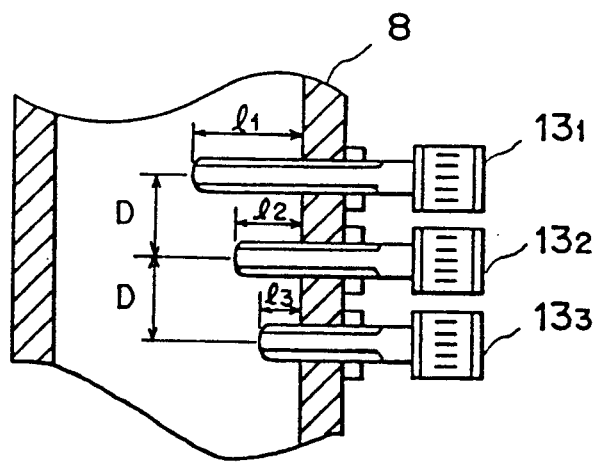
FIG. 10 is an enlarged sectional view of a waveguide used in the present invention.
Figure 11:
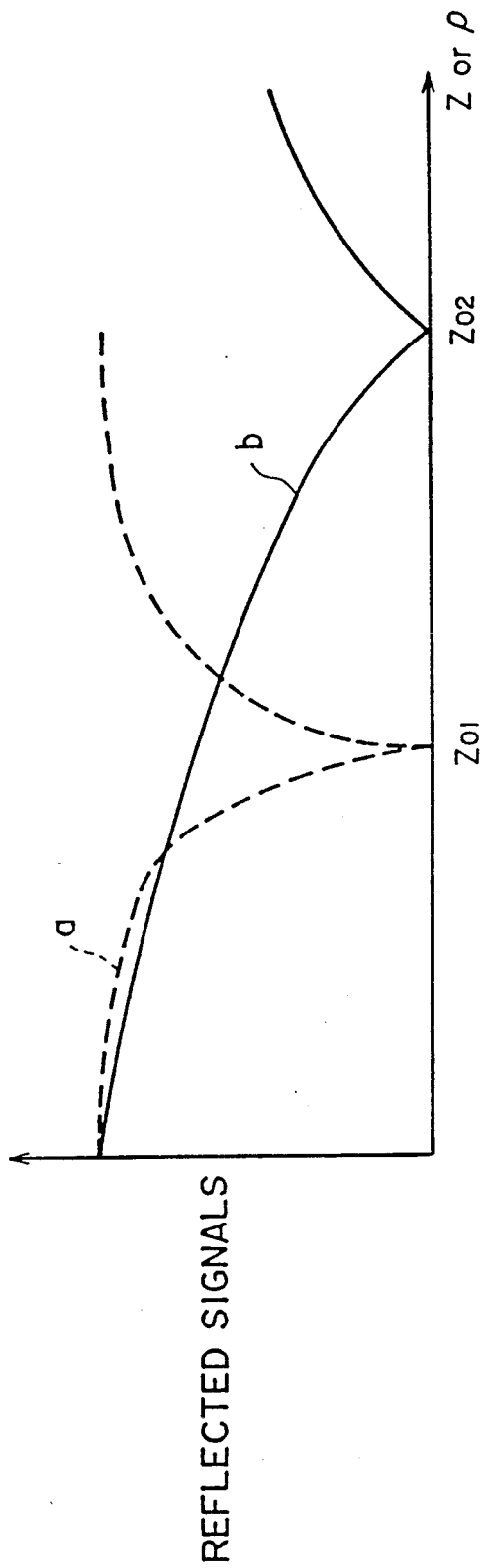
FIG. 11 is a graph showing characteristics of reflected microwave signals of the present invention.

The stub tuner 12 has a structure which is shown in the enlarged view of FIG. 10 wherein the distance D between three screws $13_1$, $13_2$ and 13hd 3 is determined by the frequency of the microwave energy to be used. The distribution circuit of the waveguide 8 may be made variable by providing the stub tuner 12 on the waveguide 8 and by adjusting the lengths $l_1$, $l_2$ and $l_3$ inserted within the waveguide 8. The above arrangement can also transform the characteristic curve of the reflected microwave signals from the curve a denoting the arrangement without the stub tuner (to position where measurement is impossible being at $Z_{01}$) to the curve b as shown in FIG. 11. The point where a measurement is impossible may be avoided for almost all materials by setting the resistivity, for example, at 100 Ωm in the case of a Si-wafer. Accordingly, the reflected microwave signals are outputted as an ideal waveform as shown in FIG. 5A. The curve b in FIG. 11 is improved to assume a relatively linear form relative to the non-linear characteristics in the region extending toward a point $Z_{02}$, and the amplitude variation or distortion of the reflected microwave can also be restricted.

Although a stub tuner is used as the means to make the equivalent distribution circuit of the waveguide variable in the above embodiment, such means is in no way limited to the above and various modifications are possible, without departing from the scope of the appended claims.

As described in the foregoing, the method and apparatus for measuring the lifetime of the semiconductor material according to the present invention is highly effective since it can measure all the semiconductor materials to obtain accurate reflected microwave signals, it can significantly enhance the overall measurement reliability as well as data reproducibility and it can realize a flexible measurement arrangement.

Figure 12:
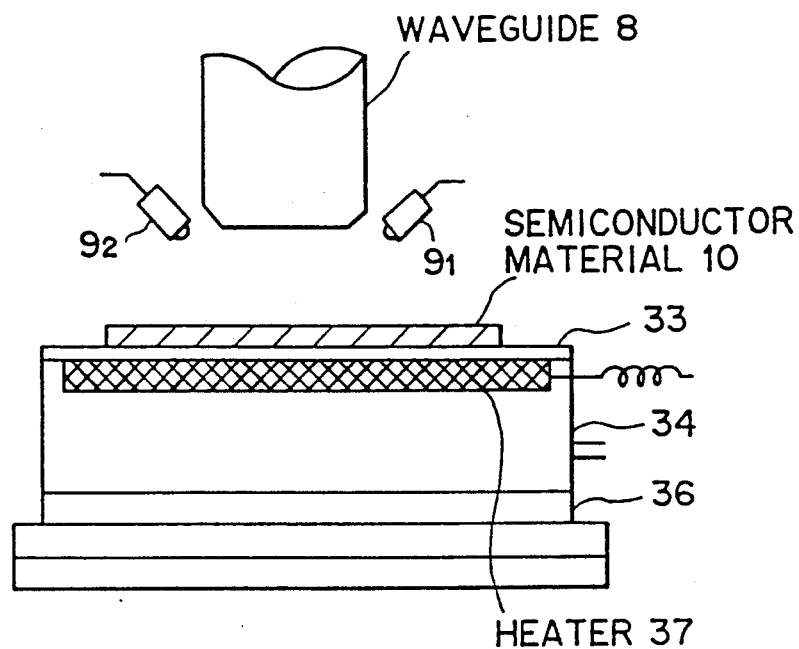
FIG. 12 is a view depicting a preferred embodiment of the measurement apparatus according to the present invention.
Figure 13A:
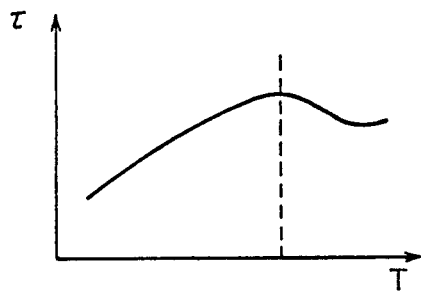
FIGS. 13A to 13D are respective graphs showing the measurement data obtained by the measurement apparatus according to the present invention.
Figure 13B:
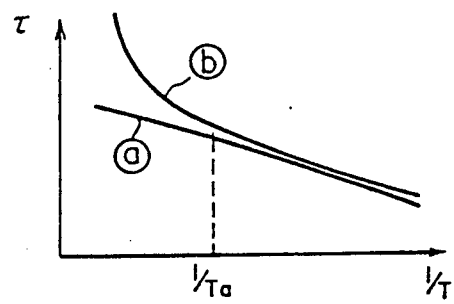

As shown in FIG. 12, a heat-resisting or refractory member 35 is placed on an X-Y stage 36 and a heater 37 is buried in the upper portion of the refractory member 34. On the refractory member 34, a non-metal refractory plate 33 is placed. The semiconductor material 10 to be measured is placed on the system consisting of the non-metal refractory plate 33 and the refractory member 34 and the X-Y stage 36. In operation, microwave energy irradiates through a waveguide 8 (for outputting and receiving the microwave energy) which is placed above the semiconductor material 10 and excitation rays of wavelengths $\lambda_1$ and $\lambda_2$ are outputted from the laser diodes $9_1$ and $9_2$. The semiconductor material 10 which is polluted by metal taints is gradually heated by the heater 37 embedded in the refractory member 34 then a lifetime of the semiconductor 10 is measured using the reflective microwave energy passing therethrough. The measurement results as shown in FIG. 13A depict large changes in the lifetime of the semiconductor material at a certain temperature. This phenomenon is generated because the energy levels of very small metal taints contained in the silicon material approach those of electrical conductors when the silicon is heated and the excited electrons are apt to disappear. FIG. 13B shows an example of the lifetime changes of measurement data in which graphed on the abscissas is the inverse temperature 1/temperature (1/T) and on the ordinates is lifetime $\tau$. Measurement data was obtained on a sample (a) of a semiconductor material having metal diffused and a second sample (b) having no metal. The lifetime of the second sample (b) is lengthened when the temperature of the semiconductor material 10 exceeds a certain level. However, the lifetime of the first sample (a) doesn't extend as much, generating a large difference between the lifetimes of the two samples. The above result has a correlation with the peak in the measurement data obtained the DLTS method as shown in FIG. 13C.

Figure 13C:
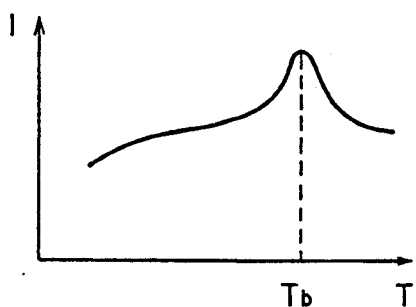
Figure 13D:
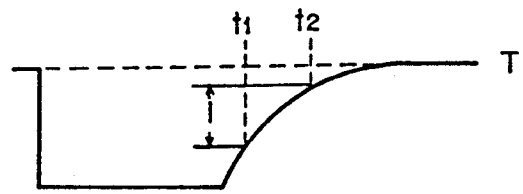

By previously determining on an experimental basis a relation between the temperature 1/Ta shown in FIG. 13B and the temperature Tb shown in FIG. 13C, according to the non-contact and non-destructive method for measuring the lifetime of the semiconductor material 10 of the present invention, it is possible to judge an existence of very small metal taints and to determine the type of such a metal. It is possible to presume that almost all of the pollutants in the semiconductor material concentrates in the surface of the semiconductor chip, so that heating the semiconductor chip and measuring its lifetime results in a lifetime of the much polluted surface of the semiconductor material and another lifetime of the little polluted interior of the semiconductor chip, and thus a separative analysis of the surface and bulk lifetimes is possible at a high S/N ratio.

While the preferred embodiments employs a heater as the heating means as herein disclosed, it is to be understood that other forms of heating might be adopted.

By measuring the lifetime of the semiconductor material after it is warmed according to the present invention, it is possible to determine the existence of fine heavy metal taints which are identified conventionally only by destructive type methods, and to separately evaluate the surface recombination velocity (surface lifetime), thus obtaining an advantageous lifetime measurement system.

It should be understood that many modifications and adaptations of the invention will become apparent to those skilled in the art and that the invention is intended to encompass such obvious modifications and changes in the scope of the claims appended hereto.

What is claimed is:

1. A lifetime measuring method for semiconductor materials having resistivity values within a predetermined measurement range, said method comprising:

supplying energy to a semiconductor material to produce carriers in said semiconductor material;

irradiating microwave energy from a waveguide onto said semiconductor material to obtain reflected microwave energy;

varying equivalent distribution circuit characteristics of said waveguide such that a variation of a magnitude of said reflected microwave energy relative to a resistivity of said semiconductor material is substantially linear within said predetermined measurement range; and, detecting said reflected microwave energy and measuring an attenuation of said produced carriers to obtain a lifetime measurement of said semiconductor material.

2. A method as recited in claim 1, wherein said varying step includes positionally adjusting plural stub tuners located within said waveguide.

3. A method as recited in claim 2, further comprising providing a distance between said plural stub tuners within said waveguide which is in accordance with a frequency of said microwave energy.

4. A lifetime measuring apparatus for semiconductor materials having resistivity values within a predetermined measurement range, said apparatus comprising:

supply means for supplying energy to a semiconductor material to produce carriers in said semiconductor material;

a waveguide for irradiating microwave energy onto said semiconductor material to obtain reflected microwave energy;

waveguide tuning means for varying equivalent distribution circuit characteristics of said waveguide such that a variation of a magnitude of said reflected microwave energy relative to a resistivity of said semiconductor material is substantially linear within said predetermined measurement range; and, means for measuring an attenuation of said produced carriers in accordance with characteristics of said reflected microwave energy to obtain a lifetime measurement of said semiconductor material.

5. A method as recited in claim 4, wherein said waveguide tuning means includes plural stub tuners located within said waveguide.

6. A method as recited in claim 5, wherein a distance between said plural stub tuners within said waveguide is in accordance with a frequency of said microwave energy.

* * * * *